United States Patent [19]

Curti

[11] Patent Number: 4,805,316
[45] Date of Patent: Feb. 21, 1989

[54] METHOD OF AND APPARATUS FOR ALIGNING PRINTED CIRCUIT CARRIERS PREPARATORY TO THE APPLICATION OF PRINTED CIRCUITS

[76] Inventor: Ezio Curti, Strada Padana Superiore 57/59, I-20063 Cernusco Sul Naviglio Milano, Italy

[21] Appl. No.: 160,367

[22] Filed: Feb. 25, 1988

[30] Foreign Application Priority Data

Feb. 25, 1987 [IT] Italy ................................ 19484 A/87

[51] Int. Cl.⁴ .......................... B23Q 3/00; B25B 11/00
[52] U.S. Cl. ......................................... 33/613; 33/614; 33/623; 33/644; 33/568; 269/903; 101/DIG. 36
[58] Field of Search ................... 33/613–623, 33/644, 645, 520, 568, 573; 269/903, 55, 58, 60, 48.1, 48.2, 52; 355/72–74; 101/DIG. 12

[56] References Cited

U.S. PATENT DOCUMENTS

| 3,098,431 | 7/1963 | Weaver | 33/614 |
| 3,196,549 | 7/1965 | Alexander | 33/520 |
| 3,381,554 | 5/1968 | Ploch et al. | 33/623 |
| 3,769,714 | 11/1973 | Anderson | 33/520 |
| 3,950,095 | 4/1976 | Bouygues et al. | 33/568 |
| 4,244,109 | 1/1981 | Silverman | 33/645 |
| 4,291,867 | 9/1981 | Williams et al. | 269/903 |
| 4,540,084 | 9/1985 | Curti | 198/468.3 |
| 4,638,985 | 1/1987 | Maeda et al. | 269/903 |
| 4,700,488 | 10/1987 | Curti | 33/613 |

OTHER PUBLICATIONS

Pokorny et al, Substrate Position Indicator, Western Electric Technical Digest No. 31, pp. 45–46, Jul. 1973.

Primary Examiner—William A. Cuchlinski, Jr.
Assistant Examiner—Patrick R. Scanlon
Attorney, Agent, or Firm—Peter K. Kontler

[57] ABSTRACT

A printed circuit carrier which is deposited on a mobile table and has two spaced-apart holes is aligned with reference to the printing unit by two locating members one of which is fixed to the table and the other of which is movable relative to the table toward and away from the one locating member. The locating members are expandible and contractible and are introduced into the holes of a carrier on the table in contracted condition to be thereupon caused or permitted to expand and to thereby center the carrier on the table. If the distance x between the axes of the holes in the carrier on the table exceeds or is less than an optimum distance x', the table, the locating members and the carrier on the table are shifted in the longitudinal direction of a line connecting the axes of the holes in a direction counter to the direction of movement of the other locating member relative to the one locating member through half the difference between x and x'. The difference between the distances x and x' is monitored by a suitable gauge which transmits signals to a microprocessor serving to control a reversible motor which shifts the table and the carrier relative to the printing unit when the distance x deviates from the distance x'.

20 Claims, 2 Drawing Sheets

METHOD OF AND APPARATUS FOR ALIGNING PRINTED CIRCUIT CARRIERS PREPARATORY TO THE APPLICATION OF PRINTED CIRCUITS

BACKGROUND OF THE INVENTION

The invention relates to the manipulation of carriers (also called boards or substrates) of printing circuits, and more particularly to improvements in methods of and in apparatus for aligning or orienting printed circuit carriers in screen printing, photoprinting and other machines for the application of printed circuits so that each of a short or long series of carriers is moved to a predetermined position for the application of a printed circuit thereto.

It is important to position the printed circuit carriers with a very high degree of accuracy prior to the application of printed circuits. This holds true regardless of whether the machine which applies printing circuits is a screen printing, an optical printing or any other machine. More specifically, the carriers must be positioned with a high degree of accuracy with respect to the printing unit which applies printed matter to a properly positioned carrier.

Commonly owned U.S. Pat. No. 4,700,488 granted Oct. 20, 1987 for "Arrangement for aligning a printed circuit substrate in a printing machine" discloses machine wherein the carriers or substrates to be provided with printed circuits are formed with pairs of indicia in the form of locating holes. These holes receive locating pins which are mounted on so-called aligning or fixing devices. In order to compensate for eventual deviations of the shape and/or size and/or position of one or more locating holes from an optimum shape, size and/or position, the patented machine comprises expandible and contractible locating pins. Deviations from an optimum position, shape and/or size of a locating hole can develop as a result of manufacturing tolerances, as a result of temperature-induced expansion or contraction of a portion of or the entire carrier and/or for a number of other reasons. The locating pins of the patented machine are contracted prior to introduction into the holes of a carrier, and the locating pins are thereupon caused to expand so as to engage the surfaces bounding the respective holes. The diameter of each locating pin in contracted condition is smaller or even much smaller than the diameter of a hole so that a contracted locating pin can be readily inserted into the hole of a carrier to be thereupon expanded into firm engagement with the surface around the hole.

Since the complexity of printed circuits is on the increase, with simultaneous reduction of the width of electric conductors, accurate positioning of a printed circuit carrier in a screen printing or optical printing machine becomes even more important. Thus, even slight deviations from an optimum position of the carrier with reference to the circuit applying unit is likely to result in non-application of one or more marginal portions of the circuit so that the imprinted carrier must be discarded.

OBJECTS AND SUMMARY OF THE INVENTION

An object of the invention is to provide a novel and improved method of adjusting the position of a printed circuit board or carrier in an optical or other printing machine with a degree of accuracy which is much higher than that achievable in accordance with heretofore known methods.

Another object of the invention is to provide a novel and improved method of selecting the positions of coordinates of a printed circuit carrier with reference to coordinates of the circuit applying or printing unit in a screen printing, optical printing or other circuit applying machine.

A further object of the invention is to provide a method which can be practiced in connection with printed circuit carriers wherein the dimensions, shapes and/or positions of indicia deviate from optimum dimensions, shapes and/or positions.

An additional object of the invention is to provide a novel and improved method of compensating for deviations of the parameters of locating indicia on printed circuit carriers from optimum parameters.

Still another object of the invention is to provide a method which renders it possible to properly position successive carriers within short intervals of time so that the machine can imprint the carriers at a high frequency.

A further object of the invention is to provide a machine for the application of printed circuits to carriers or boards with novel and improved apparatus for positioning the carriers with a high degree of accuracy relative to the printing or circuit applying unit regardless of eventual deviations of the size, shape and/or positions of locating or reference indicia on the carriers from an optimum size, shape and/or position.

An additional object of the invention is to provide a novel and improved support for printed circuit carriers and novel and improved locating members for a carrier on the support.

Another object of the invention is to provide novel and improved means for moving the support relative to the frame of a screen printing or other printed circuit applying machine, and to provide novel and improved means for ascertaining the extent of adjustment which is necessary to place a carrier on the support in an optimum position for the application of a printed circuit thereto.

An additional object of the invention is to provide a machine which can automatically compensate for temperature-induced or other deviations of the size, shape and/or positions of locating indicia on carriers of printed circuits from optimum parameters.

One feature of the present invention resides in the provision of a method of adjusting the position of a carrier which is to be provided with a printed circuit and has first and second indicia (such as sockets in the form of circular holes or bores), the indicia being spaced apart from each other an actual distance (x) which is expected to match but can deivate from a predetermined distance (x'), particularly as a result of manufacturing tolerances and/or temperature-induced expansion or contraction of the carrier. The method comprises the steps of centering the first indicium with reference to a first axis, maintaining the first axis in a predetermined position, centering the second indicium with reference to a second axis which is movable relative to the first axis to an extent which is a function of deviation of the actual distance (x) from the predetermined distance (x'), monitoring the extent of deviation of x from x' including ascertaining the extent of movement of the second axis from a position corresponding to the position of the second axis when x matches x' and the first axis assumes the predetermined position, and jointly moving the first and second axes and the carrier through half the difference between x and x'.

The second axis moves away from the first axis in a first direction when x exceeds x' and in a second direction counter to the first direction when x is less than x'. The moving step includes jointly moving the axes and the carrier in the second direction when x exceeds x' and jointly moving the axes and the carrier in the first direction when x is less than x'.

The method further comprises the steps of applying a circuit to the carrier upon completion of the moving step, and thereupon returning the first axis to the predetermined position.

The aforementioned centering axes are preferably defined by expandible male locating members which are receivable in the sockets of a carrier. The centering steps include introducing the male locating members into the respective sockets of the carrier which is to be provided with a printed circuit upon completion of the centering, monitoring and moving steps.

Another feature of the present invention resides in the provision of a machine for applying printed circuits to carriers (such as plate-like carriers) of the type having first and second indicia (e.g., in the form of sockets, especially circular through holes or bores) spaced apart from each other an actual distance x which can match but can also deviate from a predetermined distance x', particularly as a result of manufacturing tolerances and/or temperature-induced expansion or contraction of portions of or the entire carrier. The machine comprises a mobile support for carriers, a first locating member which shares the movements of the support and defines a first centering axis, and a second locating member which defines a second centering axis and is mounted on the support for movement relative to the first locating member. The first and second locating members are respectively arranged to center the first and second indicia of the carrier on the support so that the second locating member moves relative to the first locating member and relative to the support when the actual distance (x) between the indicia on the carrier which is placed onto the support deviates from x'. The machine further comprises signal generating means for monitoring the extent of deviation of the position of the second locating member from a position corresponding to that when the locating members center the respective indicia of a carrier while the actual distance x between the indicia (on the carrier which is placed onto the support) matches x', and adjusting means for moving the support and the carrier on the support in response to signals from the monitoring means through a distance matching or approximating 50 percent of the deviation of x from x'.

The machine can further comprise guide means for the support. The support is reciprocable along the guide means in parallelism with an imaginary line which connects the two centering axes. As mentioned above, the indicia can include sockets in the carriers, and the locating members can comprise preferably expandible and contractible projections (e.g., split studs, also called reference dowels) provided on the support and extending into the respective sockets of the carrier on the support.

The guide means can include stationary bearing means, and the support can include at least one elongated follower (e.g., in the form of a tie rod or rail) which is reciprocable in the bearing means.

The support can include a table having at least two spaced-apart legs, and the follower can be connected to the legs of the table.

The machine further comprises holders for the locating members. Such holders are mounted in or on the support, and the machine can further comprise means for adjustably fastening at least one of the holders to the support, particularly to the follower of the support. Both holders can be mounted on the follower, and the second locating member can be movably mounted on or in its holder so that it can move relative to the holder for the first locating member in the longitudinal direction of the follower. The table of the support can be provided with an opening or window (e.g., in the form of an elongated slot) through and beyond which the locating members extend so that the holders can be disposed at one side of the table and the carrier which is to be provided with a circuit can be placed onto the locating members at the other side of the table.

The holder for the first locating member can be movably mounted on the support, and the machine preferably further comprises fastener means for releasably locking the holder for the first locating member to the support, e.g., to the follower.

The holder for the second locating member can comprise or can be mounted on or in a preferably C-shaped housing which is movable relative to the support in the longitudinal direction of the follower and can be releasably locked in a selected position by a screw or by other suitable fastener means, and a carriage or slide for the second locating member. The carriage is reciprocable relative to the housing in the longitudinal direction of the follower. Such holder can further comprise means for biasing the second locating member to a preselected position relative to the housing. For example, the housing can comprise two spaced-apart arms and the carriage can comprise a shaft which is reciprocably mounted in the arms. The biasing means can include resilient elements (e.g., coil springs) which react against the arms and bear against the second locating member.

The monitoring means can include sensor means in direct or indirect contact with the second locating member so as to follow the movements of the second locating member relative to the support.

The adjusting means can comprise a reversible motor, and such motor can have a threaded rotary output element (such as a feed screw) which mates with the support.

The table is preferably located in a substantially horizontal plane, and the machine comprises means above the table for applying a circuit to the carrier on the support upon completed adjustment of the support by the moving means. The monitoring means can include programming means (such as a microprocessor) which is operative to initiate a movement of the support to a predetermined starting position upon completion of application of a circuit to the carrier on the support. Such movement of the support to predetermined position is shared at least by the first locating member.

The novel features which are considered as characteristic of the invention are set forth in particular in the appended claims. The improved machine itself, however, both as to its construction and its mode of operation, together with additional features and advantages thereof, will be best understood upon perusal of the following detailed description of certain specific embodiments with reference to the accompanying drawing.

DESCRIPTION OF THE PREFERRED EMBODIMENTS

Figure 1:
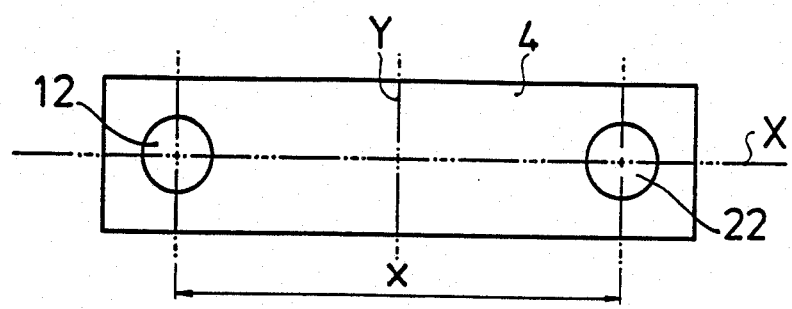
FIG. 1 is a plan view of a printed circuit carrier or board with two locating indicia in the form of circular holes whose centers are located at a desired predetermined distance from each other.

FIG. 1 shows a plate-like elongated rectangular printed circuit carrier or board 4 which has two locating indicia 12, 22 in the form of circular bores or holes. The centers of the holes 12, 22 are spaced apart from one another an actual distance x which equals or closely approximates a desired or optimum (predetermined) distance x' between the centering axes 18, 19 of two spaced-apart male locating members or dowels 11, 21 shown in FIGS. 2 to 5. The diameter of the hole 12 is assumed to match the diameter of the hole 22. However, it happens from time to time that the diameter of the hole 12 in a particular carrier 4 deviates from the diameter of the hole 22 and/or that the distance x between such holes deviates from the predetermined distance x' for one or more reasons, for example, as a result of manufacturing tolerances and/or as a result of temperature-induced partial or complete expansion or contraction of the carrier. It has been found, in actual practice, that the diameter of the hole 12 and/or 22 often deviates (even considerably) from the desired or optimum diameter, and this could lead to inaccurate positioning of such carrier in the machine wherein the carrier is to be provided with a printed circuit.

The line X denotes in FIG. 1 a first coordinate of the carrier 4, and such line includes the centers of the holes 12 and 22 in a satisfactory carrier. A second coordinate Y crosses the coordinate X at right angles midway between the axes of the holes 12, 22

Figure 2:
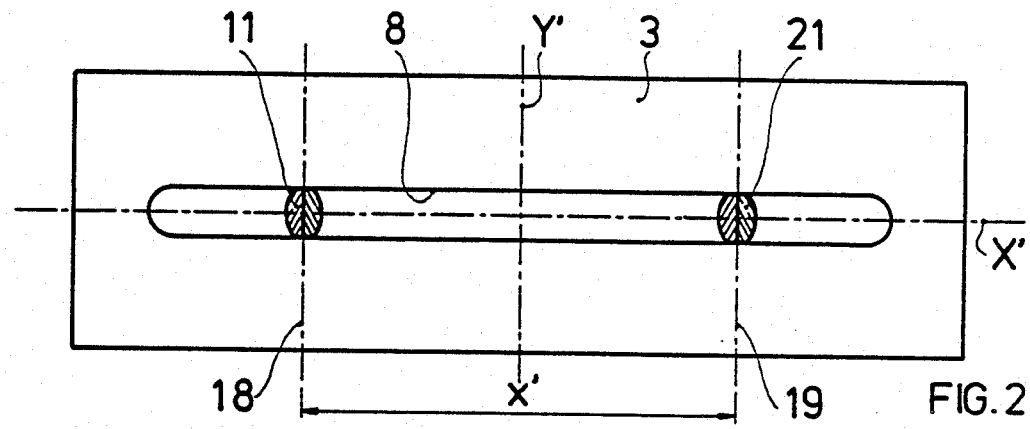
FIG. 2 is a plan view of a table forming part of a support for printed circuit carriers, further showing two male locating members which are shown in a horizontal sectional view and extend through and beyond an elongated slot-like window in the table.

FIG. 2 shows that the horizontal table 3 of a support for the carrier 4 is formed with a longitudinally extending slot-like window 8 for the male locating members 11 and 21. These locating members are contracted, i.e., their prongs or halves abut each other. The centering axis 18 of the locating member 11 is held in a predetermined position (corresponding to a predetermined or preselected position of the table 3 and of the entire support which includes the table). The locating member 21 is movable toward and away from the locating member 11 and hence relative to the table 3 in the longitudinal direction of the window 8.

When a satisfactory carrier 4 is properly centered by the male locating members 11 and 21, the coordinate X of the carrier coincides with a coordinate X' of the table 3, and a coordinate Y' of the table 3 coincides with the coordinate X of the carrier. In accordance with my improved method, this can be accomplished even if the diameter of the hole 12 and/or 22 deviates from an optimum diameter and even if the distance x deviates from the predetermined distance x'. The latter distance matches that between the centering axes 18, 19 of the locating members 11, 21 when the locating member 21 is free to assume a preselected neutral position relative to the locating member 11 which latter is normally affixed to the support including the table 3).

Figure 3:
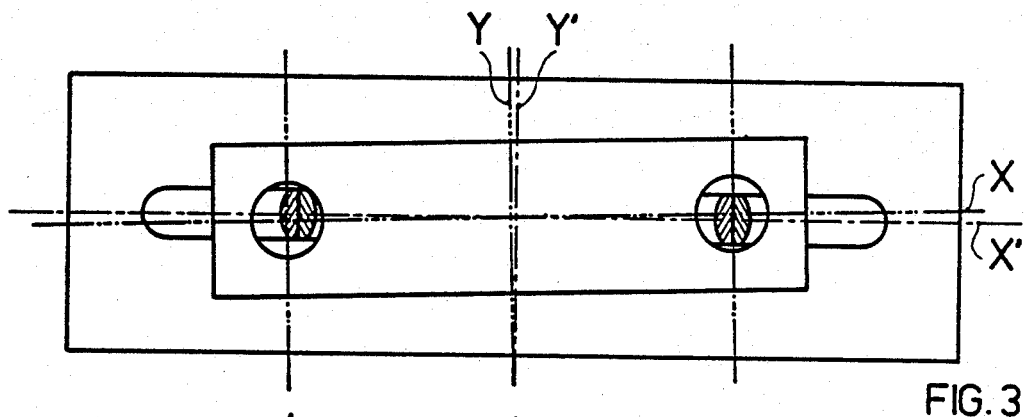
FIG. 3 shows the carrier on the table, with the locating members contracted and extending into the indicia of the carrier on the table.

In the first step, the locating members 11 and 21 are caused to contract, for example, in a manner as disclosed in the aforementioned U.S. Pat. No. 4,700,488, so that their dimensions in the longitudinal direction of the window 8 are invariably smaller than the diameter of a hole 12 or 22, even if the diameter of the hole 12 or 22 is well below a standard diameter. This ensures that the contracted locating members 11 and 21 can readily enter the respective holes 12, 22 of the carrier 4 on the table 3. FIG. 3 shows the locating members 11 and 21 in inserted positions; it will be seen that the contracted locating members 11, 21 are received in the respective holes 12, 22 with a certain amount of play so that the carrier 4 lies askew, i.e., its coordinates X and Y do not register with the corresponding coordinates X' and Y' of the table 3.

In the next step, the locating members 11 and 21 are expanded so that their prongs engage the internal surfaces of the carrier 4 around the respective holes 11, 21 (note FIG. 4) whereby the coordinates X and Y are automatically moved to positions of register with the coordinates X' and Y', respectively, because the distance x matches or very closely approximates the predetermined distance x'.

Figure 4:
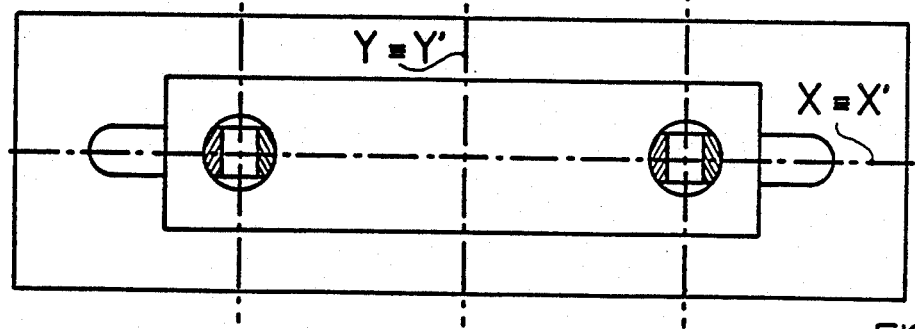
FIG. 4 shows the structure of FIG. 3 but with the male locating members expanded so that they center the carrier on the table.

If the distance x exceeds the distance x', the entire locating member 21 moves to the right, as seen in FIG. 3, i.e., in a (first) direction away from the locating member 11. If the distance x is less than the distance x', the locating member 21 moves to the left, as seen in FIG. 3, i.e., in a (second) direction toward the locating member 11. The extent to which the position of the axis 19 (in expanded condition of the locating members 11 and 21) deviates from the expected or optimum position is ascertained by a monitoring means in a manner to be described with reference to FIG. 5 to thus ascertain the (positive or negative) difference between x and x', and the difference is halved by a microprocessor of the monitoring means before the table 3 with the locating members 11, 21 and with the carrier 4 on the table 3 is shifted through half the difference between x and x' in the second direction (the locating members 11 and 21 move to the left, as seen in FIG. 4) if x is greater than x' and through half the difference between x and x' in the first direction (the locating members 11 and 21 move to the right) if x is smaller than x'. This ensures that the coordinates X and Y respectively register with the coordinates X' and Y' prior to start of application of a printing circuit to the carrier 4 on the table 3. Thus, the improved method ensures an accurate alignment of the carrier 4 with the table 3 in two different directions by the simple expedient of first introducing the locating members 11 and 21 (in contracted condition) into the respective holes 12, 22, by thereupon expanding the locating members 11 and 21, by thereupon ascertaining the positive or negative deviation of x from x', and by thereafter shifting the carrier 4 and the table 3 (together with the locating members 11 and 21) in the direction of the coordinates X and X' to the left if x is greater than x' and to the right if x' is greater than x.

FIGS. 3 and 4 show that the expanding locating members 11 and 21 can automatically move the coordinates X and Y into register with the coordinates Y' so that no further adjustment is necessary if x matches x'. If x deviates from x', the monitoring means of the printing machine automatically ascertains the difference and the (positive or negative) sign of the difference between x and x' and initiates a shifting of the table 3 with the carrier 4 thereon in the direction of the registering coordinates X and X', namely in the direction of the line which connects the centering axes 18 and 19 for the holes 12 and 22 in the carrier 4 on the table 3. The inclination of the coordinates X and Y with reference to the coordinates X' and Y' is exaggerated in FIG. 3 for the sake of clarity.

Figure 5:
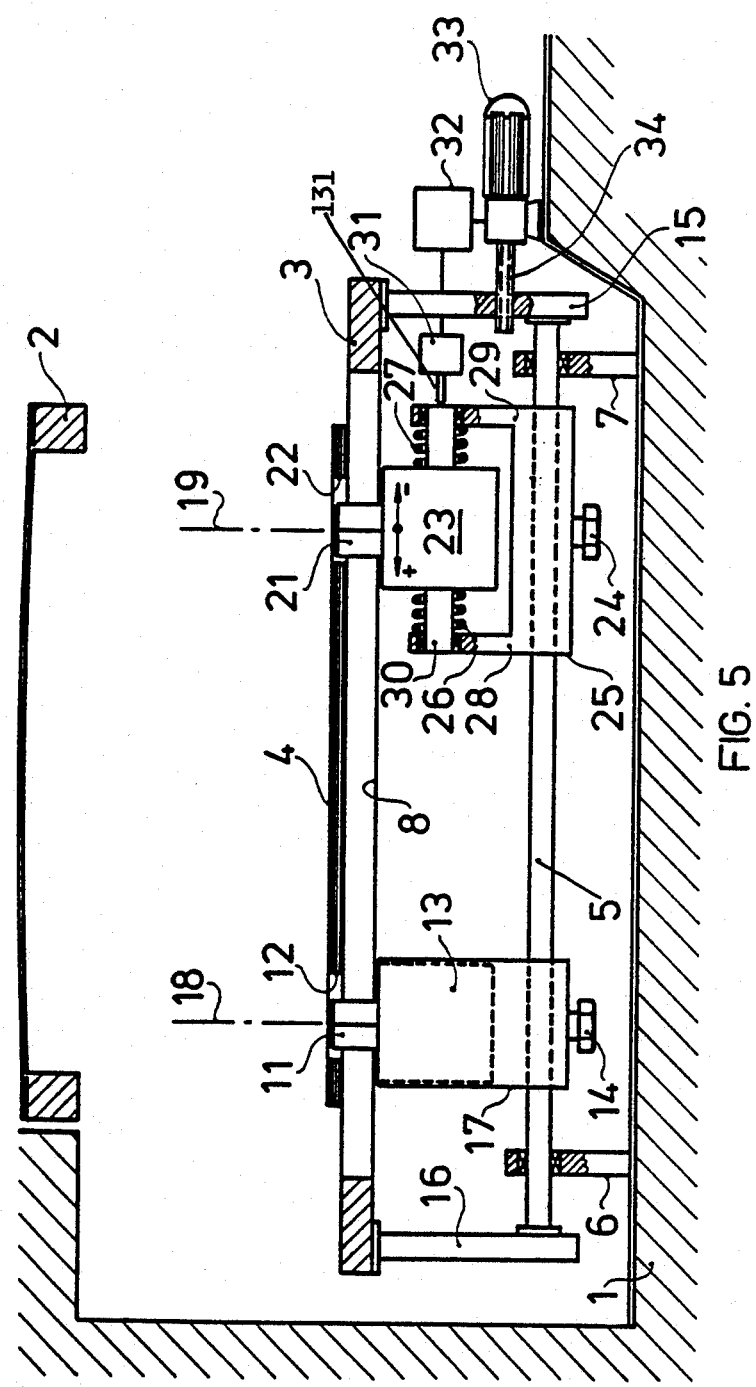
FIG. 5 is a somewhat schematic partly vertical sectional view of a machine which embodies the novel aligning apparatus, a carrier being shown on the table of the support and the male locating members being shown in the positions corresponding to those depicted in FIG. 3.

FIG. 5 shows certain details of a machine which is used to apply printed circuits to successive carriers 4 on the table 3 of the support. The latter further includes two downwardly extending portions or legs 15, 16 which are disposed at the ends of the table 3, and at least one elongated follower 5 (here shown in the form of a tie rod) whose end portions are affixed to the lower end portions of the legs 15, 16. The guide means for the follower 5 comprises two spaced apart bearings 6, 7 which are mounted in the frame or housing 1 of the machine at a level below the support 3, 5, 15, 16. The character 2 denotes a printing unit which is lowered when the alignment of the carrier 4 with reference to such unit is completed so as to apply to the upper side of the centered and otherwise adjusted carrier a printed circuit in a manner not forming part of the invention. The machine can constitute a screen printing or an optical printing machine. The details of the printing unit 2 form no part of the invention which is concerned with the method of and with means for properly positioning or aligning a carrier 4 in the machine prior to the application of a printed circuit thereto.

The locating members 11 and 21 are respectively mounted in block-shaped holders 13, 23. The holder 13 is installed in a receiving means 17 which is releasably locked to the support (namely to the follower 5) by one or more screws 14 or similar fasteners. The holder 23 for the locating member 21 is mounted on a slide or carriage including one or more shafts 30 which are parallel to the follower 5 and are reciprocable in the upwardly extending arms 28, 29 of a C-shaped housing 25 which is releasably locked to the support (namely to the follower 5 of the support) by one or more screws 24 or analogous fasteners. As can be seen in FIG. 5, the locating members 11 and 21 extend upwardly from the respective holders 13, 23 through and beyond the window 8 of the table 3 and into the respective indicia (holes 12, 22) of the carrier 4 on the table 3. The receiving means 17 for the holder 13 is provided with a bore or hole for the adjacent portion of the follower 5, and a similar bore or hole for the follower 5 is provided in the web of the C-shaped housing 25.

The holder 23 for the locating member 21 is biased to a predetermined neutral position by two coil springs 26, 27 which surround the carriage 30, which respectively react against the arms 28, 29 and which bear against the respective sides of the holder 23. The carriage 30 will leave its neutral position to stress the spring 26 or 27 when the distance x deviates from the distance x', i.e., when the distance between the centering axes 18, 19 of the locating members 11, 21 (in a predetermined starting position of the locating member 11 and in that position of the (expanded) locating member 21 in which the latter engages the surface bounding the hole 22 so that the carrier 4 cannot wobble relative to the table 3) is greater or less than x'. The coil springs 26 and 27 can be replaced with other types of biasing elements without departing from the spirit of the invention; all that counts is to ensure that the holder 23 and the locating member 21 are normally held in a predetermined position relative to the holder 13 and locating member, at least before the tips of the locating members 11, 21 enter the holes 12, 22 of a carrier 4 on the table 3.

The screws 14, 24 are loosened when a first series of carriers 4 (wherein the centers of the holes 12, 22 are disposed at a first distance x from each other) is followed by a second series of carriers wherein the centers of the holes 12, 22 are disposed at a different second distance from each other. Once the adjustment is completed, the screws 14, 24 are tightened and the positions of the holder 13 and housing 25 relative to the follower 5 thereupon remain unchanged until and unless the second series of carriers 4 is followed by a third series wherein the distance between the centers of the holes 12, 22 deviates from the aforementioned second distance. The distance x can vary from carrier to carrier regardless of whether the overall dimensions (length and width and thickness) of the carriers are or are not the same.

The exact manner in which the locating members 11 and 21 can be expanded and contracted can be the same as disclosed in U.S. Pat. No. 4,700,488. The manner in which successive carriers 4 are fed onto the table 3 is or can be the same as disclosed in commonly owned U.S. Pat. No. 4,540,084. Expansion or contraction of the locating member 11 takes place without changing the position of the centering axis 18 with reference to the table 3 and follower 5 (as long as the screw 14 locks the holder 13 and its receiving means 17 to the follower 5).

The machine further comprises means 31 for monitoring the position of the locating member 21 relative to the support including the table 3, the follower 5 and the legs 15, 16. The monitoring means 31 is designed to generate signals which are indicative of the extent of deviation of x from x' The illustrated monitoring means 31 is mounted &on and shares the movements of the support 3, 5, 15, 16 relative to the bearings 6, 7 and frame 1 and includes a mobile sensor 131 which engages the adjacent end face of the carriage 30 (the latter shares the movements of the locating member 21 and its holder 23 with reference to the table 3 and locating member 11). Signals which are generated by the monitoring device 31 (the exact construction of this device forms no part of the invention because it is possible to employ any commercially available distance measuring device) are transmitted to a control unit 32 which can include or constitute a microprocessor serving to control the operation of an adjusting or moving device including a reversible electric motor 33 having a threaded rotary output element 34 in mesh with the adjacent portion of the leg 15 of the support for the carrier 4. The monitoring device 31 is assumed to employ a transducer which is designed to transmit electric signals denoting the difference between x and x' as well as the (positive or negative) sign of the difference so as to enable the microprocessor 32 to determine the direction of rotation of the output element 34 and hence the direction of movement of the support 3, 5, 15, 16 relative to the guide means (bearings 6, 7) in the frame 1. It is also possible to employ a proximity detector which is equipped with optoelectronic transducer means serving to generate signals which denote the extent of movement of the locating member 21 toward or away from the locating member 11 (i.e., relative to the table 3) in response to expansion of the locating members 11, 21 in the respective holes 12, 22 of the carrier 4 on the table 3. Signals which are transmitted by the monitoring device 31 can be amplified in or ahead of the microprocessor 32. The manner in which the microprocessor generates and transmits signals to the motor 33 so that the latter moves the table 3 and the locating members 11, 21 through half the distance matching or closely approximating the difference between x and x' forms no part of the present invention. Microprocessors which can perform such tasks are available on the market.

The mode of operation of the machine of FIG. 5 is as follows:

The receiving means 17 for the holder 13 and the housing 25 for the carriage 30 for the holder 23 are locked to the follower 5 of the support by the respective screws 14, 24 so that the distance between the centering axes 18, 19 matches the anticipated distance x between the centers of holes 12, 22 of a series of carriers 4 which are to be provided with printed circuits. The springs 26, 27 maintain the holder 23 and the locating member 21 in a preselected position with reference to the housing 25 (i.e., with reference to the support including the table 3, the follower 5 and the legs 15, 16). The locating members 11, 21 are maintained in contracted condition when a carrier 4 is delivered onto the table 3 so that the tips of the locating members 11, 21 can readily enter the respective holes 12, 22 of such carrier. In the next step, the locating members 11, 21 are expanded so that their prongs assume the positions which are shown in FIG. 4, i.e., those positions in which the carrier 4 is held without wobbling and its coordinates X, Y respectively coincide with the coordinates X', Y' of the table 3. The hole 12 is automatically centered in response to expansion of the locating member 11, i.e. the centering axis 18 coincides with the axis of the hole 12. As mentioned above, at such time the axis 18 cannot be shifted relative to the support including the table 3 and the follower 5. The expanded locating member 21 automatically centers the hole 22 without being shifted against the opposition of the spring 26 or 27 if the distance x matches the distance x', i.e., if the axes of the holes 12, 22 in the carrier 4 on the table 3 are spaced apart from each other a distance which matches the predetermined or expected distance. If the distance x deviates from x', the holder 23 and the locating member 21 move toward or away from the locating member 11, i.e., the centering axis 19 moves nearer to or further away from the centering axis 18 while the locating member 21 expends to move each of its prongs into contact with the surface surrounding the hole 22.

The sensor 131 of the monitoring device 31 moves with the carriage 30 (and hence with the holder 23 and locating member 21) relative to the locating member 11, and the output of the device 31 transmits a corresponding signal to the microprocessor 32 which, in turn, transmits to the motor 33 a signal which initiates a movement of the table 3 and locating members 11, 21 through half the difference between the distances x and x' in a direction to the left if the locating member 21 was moved to the right (relative to the locating member 11) and in a direction to the right if the locating member 21 was moved to the left. The output element 34 of the motor 33 preferably constitutes a feed screw which is capable of shifting the table and the carrier 4 thereon through relatively large as well as through short or extremely short distances so as to ensure that the carrier 4 on the table 3 assumes an optimum position with reference to the printing unit 2 before the latter is caused to apply a printing circuit.

When the printing operation is completed, the motor 33 receives from the microprocessor 32 a signal (if necessary) to return the table 3 and the locating members 11, 21 to a predetermined starting position, namely to move the centering axis 18 to a predetermined starting position. Such return movement of the table 3 to a predetermined starting position is needed if alignment of the carrier 4 on the table 3 with the printing unit 2 necessitated a shifting of the table 3 from its predetermined starting position. If the distance x matches the distance x', the motor 33 remains idle because it is not necessary to move the support 3, 5, 15, 16 with reference to the guide means (bearings 6, 7) and frame 1 of the printing machine.

Once the table 3 reassumes its starting position, the machine is ready to receive a fresh carrier 4 which is thereupon centered and aligned with the printing unit 2 in the same way as described above.

The motor 33 must be actuated by the microprocessor 32 only if the machining tolerances and/or temperature-induced expansion or contraction of the carrier 4 on the table 3 and/or any other factors necessitate a shifting of the table 3 and follower 5 relative to the bearings 6, 7 prior to start of a printing operation. The magnitude of acceptable tolerances is determined by the locating members 11, 21 during their expansion to move all of their prongs into engagement with the surfaces bounding the respective holes 12 and 22.

The improved machine is susceptible of many additional modifications. For example, the indicia in or on the carriers 4 need not be in the form of bores or holes. The carriers 4 can be provided with indicia in the form of triangular and/or otherwise configured sockets (such as through holes, recesses or depressions in the carriers). The sockets can be produced by milling, stamping or in any other suitable way. It goes without saying that the cross-sectional outlines of the locating members can or must be changed if the shape of the indicia on the carriers 4 deviates from that of the indicia 12, 22 which are shown in the drawing, for example, if the indicia are in the form of triangular recesses or holes. Such indicia can be provided in the longitudinal or lateral edge faces of the carrier. As described above, it is necessary to maintain one of the locating members in a fixed position (relative to the support) while the other locating member is free to move toward or away from the fixed (one) locating member. For example, if one shorter edge face of the carrier on the table 3 is formed with a first triangular recess for the locating member 11, the other shorter edge face of such carrier is or can be provided with a second triangular, recess for the locating member 21. The locating member 21 can enter the respective triangular recess earlier than expected (the distance x exceeds the distance x') or later than expected (x is less than x'), i.e., it is thereafter necessary to shift the table and the locating members as well as the carrier in the direction of the line which connects the centering axes of the two locating members. Locating members which are designed to enter triangular recesses need not be of the contractible and expandible type.

An important advantage of the improved method and machine is that the position of a carrier on the support with reference to the printing unit can be adjusted with a very high degree of accuracy, that such adjustment can be carried out automatically, and that the adjustment is completed within a very short interval of time. Moreover, eventual remaining deviations of the adjusted position from an optimum position are negligible and do not affect the accuracy of the printing operation because such deviations are uniformly distributed in all directions of the carrier.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of my contribution to the art and, therefore, such adaptations should and are intended to be comprehended within the meaning and range of equivalence of the appended claims.

I claim:

1. A method of adjusting the position of a carrier which is to be provided with a printed circuit and has first and second indicia spaced apart from each other an actual distance which is expected to match but can deviate from a predetermined distance, particularly as a result of manufacturing tolerances and/or temperature-induced expansion or contraction of the carrier, comprising the steps of centering the first indicium with reference to a first axis; maintaining the first axis in a predetermined position; centering the second indicium with reference to a second axis movable relative to the first axis to an extent which is a function of deviation of the actual distance from the predetermined distance; monitoring the extent of deviation of the actual distance from the predetermined distance including ascertaining the extent of movement of the second axis from a position corresponding to the position of second axis when the actual distance matches the predetermined distance and the first axis assumes the predetermined position; and jointly moving the first and second axes and the carrier through half the difference between the actual distance and the predetermined distance.

2. The method of claim 1, wherein the second axis moves away from the first axis in a first direction when the actual distance exceeds the predetermined distance and in a second direction counter to the first direction when the actual distance is less than the predetermined distance, said moving step including jointly moving the axes in said second direction when the actual distance exceeds the predetermined distance and jointly moving the axes in said first direction when the actual distance is less than the predetermined distance.

3. The method of claim 2, further comprising the steps of applying a printed circuit to the carrier upon completion of the moving step, and thereupon returning the first axis to the predetermined position.

4. The method of claim 2, wherein the indicia are sockets in the carrier and the axes are defined by expandible male locating members which are receivable in the sockets of the carrier, said centering steps including introducing the locating members into the respective sockets of the carrier.

5. A machine for applying printed circuits to carriers of the type having first and second indicia spaced apart from one another an actual distance which is expected to match but can deviate from a predetermined distance, particularly as a result of manufacturing tolerances and/or temperature-induced expansion or contraction of the carrier, comprising a mobile support for carriers; a first locating member arranged to share the movements of said support and defining a first centering axis; a second locating member defining a second centering axis and being mounted on said support for movement relative to said first locating member, said first and second locating members being respectively arranged to center the first and second indicia of the carrier on said support so that the second locating member moves relative to the first locating member and relative to said support when the actual distance between the indicia of the carrier on said support deviates from the predetermined distance; signal generating means for monitoring the extent of deviation of the position of said second locating member from a position corresponding to that when the locating members center the respective indicia of a carrier while the actual distance between the indicia matches said predetermined distance; and adjusting means for moving said support and the carrier thereon in response to signals from said monitoring means through a distance matching or approximating 50 percent of the extent of deviation.

6. The machine of claim 5, further comprising guide means for said support, said support being reciprocable along said guide means in parallelism with a line connecting said centering axes, said indicia including sockets in the carriers and said locating members including projections provided on said support and extending into the respective sockets of the carrier on said support.

7. The machine of claim 6, wherein said guide means includes stationary bearing means and said support includes at least one elongated follower which is reciprocable in said bearing means.

8. The machine of claim 7, wherein said support includes a table having two spaced-apart legs, said follower being connected with said legs.

9. The machine of claim 7, further comprising holders for said locating members, said holders being mounted on said follower and said second locating member being movable relative to and in the longitudinal direction of said follower.

10. The machine of claim 7, further comprising holders for said locating members and means for adjustably fastening at least one of said holders to said support.

11. The machine of claim 7, wherein said support has an opening and said projections extend through said opening.

12. The machine of claim 7, further comprising a holder for said first locating member, said holder being movably mounted on support and further comprising fastener means for releasably locking said holder to said support.

13. The machine of claim 7, further comprising a holder for said second locating member, said holder including a housing movable relative to said support in the longitudinal direction of said follower, fastener means for releasably locking said housing to said support, and a carriage for said second locating member, said carriage being reciprocable relative to said housing in the longitudinal direction of said follower.

14. The machine of claim 13, wherein said holder further comprises means for biasing said second locating member to a preselected position with reference to said housing.

15. The machine of claim 14, wherein said housing comprises two spaced apart arms and said carriage comprises a shaft which is reciprocably mounted in said arms in parallelism with said follower, said biasing means comprising resilient elements reacting against said arms and bearing against said second locating member.

16. The machine of claim 5, wherein said monitoring means includes sensor means arranged to track the position of said second locating member.

17. The machine of claim 5, wherein said adjusting means comprises a reversible motor.

18. The machine of claim 17, wherein said motor has a threaded rotary output element mating with said support.

19. The machine of claim 5, wherein said support includes a substantially horizontal table and said locating members have portions extending above said table, and further comprising means for applying a circuit to the carrier on said support upon completed adjustment of said support by said moving means.

20. The machine of claim 19, wherein said monitoring means includes programming means operative to initiate a movement of said support to a predetermined position upon completion of the application of a circuit to the carrier on said support.

* * * * *